United States Patent [19]

Sullivan

[11] Patent Number: 4,696,701
[45] Date of Patent: Sep. 29, 1987

[54] EPITAXIAL FRONT SEAL FOR A WAFER

[75] Inventor: Daniel J. Sullivan, Phoenix, Ariz.

[73] Assignee: Motorola, Inc., Schaumburg, Ill.

[21] Appl. No.: 929,320

[22] Filed: Nov. 12, 1986

[51] Int. Cl.$^4$ ...................... H01L 29/36; H01L 29/38
[52] U.S. Cl. ...................................... 148/33.5; 437/95
[58] Field of Search .................... 148/33.5, 33.6, 33.4, 148/33.3

[56] References Cited

U.S. PATENT DOCUMENTS

| | | | |
|---|---|---|---|
| 3,454,434 | 7/1969 | Jackson, Jr. et al. | 148/33.5 |
| 3,488,235 | 1/1970 | Walczak et al. | 148/33.5 |
| 3,904,449 | 9/1975 | Dilorenzo et al. | 148/175 |

OTHER PUBLICATIONS

Doo et al., IBM Tech. Disc. Bull. V. 5 (1962), pp. 50–51.

Ghandhi, *VLSI Fabrication Principles,* John Wiley & Sons (New York), 1983, pp. 128–132, 164, 165.

*Primary Examiner*—Olik Chaudhuri
*Attorney, Agent, or Firm*—Joe E. Barbee

[57] ABSTRACT

A thin high resistivity epitaxial layer is provided over the entire surface of a semiconductor wafer in order to minimize autodoping while growing a desired epitaxial layer over the entire semiconductor wafer. The thin low resistivity epitaxial layer acts as a seal and is of the same conductivity type as the semiconductor wafer or substrate. The thin epitaxial layer effectively becomes a part of the substrate or semiconductor wafer. The seal layer or thin epitaxial layer is needed when growing an epitaxial layer over a very low resistivity silicon semiconductor wafer.

5 Claims, 2 Drawing Figures

EPITAXIAL FRONT SEAL FOR A WAFER

BACKGROUND OF THE INVENTION

This invention relates, in general, to the manufacture of semiconductor wafers, and more particularly, to reducing autodoping during the growing of an epitaxial layer on a semiconductor wafer.

Autodoping has been a persistent problem to the deposition of epitaxial layers on a semiconductor substrate. This is particularly true for a low resistivity semiconductor substrate. Autodoping is a result of two distinct occurrences; one is that caused by outdiffusion from the low resistivity substrate into the epitaxial layer, and the other is that caused by vaporization of the impurities in the substrate which enter into a gaseous phase of the epitaxial layer being deposited. The autodoping affect produces an epitaxial layer having nonuniform impurity concentrations. Therefore, it is difficult if not impossible to accurately control the impurity concentration within the epitaxial layer because of the autodoping affects. Autodoping can cause a semiconductor wafer to be a low yielding wafer.

Since antimony outdiffuses less than arsenic, boron, or phosphorous, many semiconductor wafer manufacturers use antimony as the impurity dopant in the semiconductor wafer. However, some semiconductor devices require low resistivity substrates and therefore the semiconductor manufacturer is left with no choice but to use phosphorous or arsenic. Since autodoping can also result from vaporization of impurities from the backside of the wafer, it is generally customary to seal the backside of the wafer with a backseal such as oxide or nitride. There is not believed to be an effective front seal for the front or top of the wafer.

Autodoping from a highly doped diffused region in a substrate during growth of an epitaxial layer has been reduced by the growing of a thin epitaxial layer over the entire surface of the substrate and then removing the epitaxial layer except for the portion over the highly doped diffused region. Typically this thin epitaxial portion then becomes part of the subsequently grown epitaxial layer, the substrate is of a different conductivity type than the small portion of thin epitaxial layer, and such autodoping minimization is believed to have only been used for integrated circuits. Examples of this technique can be found in U.S. Pat. No. 3,660,180 which issued to Wajda, and in U.S. Pat. No. 3,716,422 which issued to Ing et al. Minimizing autodoping is also discussed in *IBM Technical Disclosure Bulletin*, Vol. 14., No. 11, April 1972, page 3218; *IBM Technical Disclosure Bulletin*, Vol. 15, No. 11, April 1973, page 3385; and in *IBM Technical Disclosure Bulletin*, Vol. 20, No. 3, August 1977, pages 1083-1084. However, it would be desirable to provide a front seal for an entire wafer and not just for a localized highly doped region.

Accordingly, it is an object of the present invention to minimize autodoping from a low resistivity semiconductor wafer.

Another object of the present invention is to minimize autodoping from a low resistivity wafer during the growing of an epitaxial layer over the wafer by using a thin epitaxial layer of the same conductivity as the wafer and which serves as a seal.

Yet a further object of the present invention is to provide an epitaxial front seal for a low resistivity N-type substrate so that aluminum can be used as a back metal.

SUMMARY OF THE INVENTION

The above and other objects and advantages of the present invention are provided by a thin epitaxial layer deposited on a very low resistivity semiconductor substrate. The thin epitaxial layer is also low resistivity and is of the same conductivity type as the substrate. The low resistivity thin epitaxial layer becomes a part of the substrate. The desired resistivity of the thin epitaxial layer which serves as the front seal should have a resistivity of 0.1 to 1.5 ohms cm for an N-type conductivity substrate or 0.5 to 4.5 ohms cm for a P-type conductivity substrate. The desired epitaxial layer is then grown over the thin epitaxial layer which serves as a seal. The seal eliminates or minimizes the autodoping affects occurring in the disired epitaxial layers.

DETAILED DESCRIPTION OF THE DRAWINGS

Figure 1:
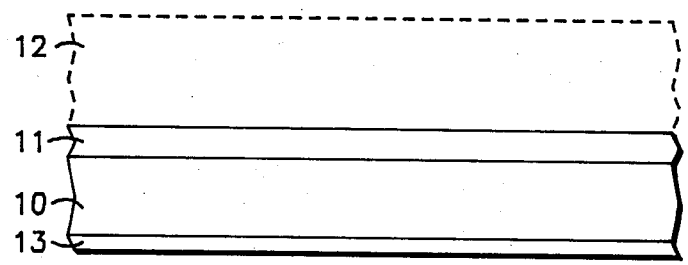
FIG. 1 illustrates a general embodiment of the present invention.

FIG. 1 illustrates a structure which minimizes the outdiffusion or autodoping of heavily doped substrates. Semiconductor substrate or wafer 10 is a heavily doped substrate having a maximum resistivity of approximately 0.0055 ohm cm for an N-type conductivity substrate or a maximum 0.02 ohm cm resistivity for a P-type conductivity substrate. Substrate 10 has a backside seal 13 which can be oxide, nitride, or the like. The use of aluminum as a back metal improves the silicon adherence to a smooth silicon and is useful in some semiconductor devices such as NPN or PNP transistor structures, for example. A front seal 11 covers the top side of substrate 10 has a thin epitaxial layer of the same conductivity type as substrate 10. The desired resistivity range for seal layer 11 is 0.1 to 1.5 ohm cm an N-type conductivity substrate 10 or 0.5 to 4.5 ohm cm for a P-type conductivity substrate 10. The exact resistivity chosen within this range will depend largely on the particular resistivity of the following epi layer. If the resistivity of seal layer 11 is too high it will act like a part of the active device structure, i.e., it will contribute to the extended basewidth of a resultant bipolar device thereby lowering high level current gain, $H_{fe}$, and decreasing switching speed. If the resistivity of seal layer 11 is too low the seal layer itself will begin to act as a strong source of unwanted doping as would a low resistivity substrate that is unprotected by seal layer 11. The thickness of seal layer 11 is somewhat critical. If seal layer 11 is too thick its cost will be unnecessarily high due to the longer time spent in the reactor chamber. If seal layer 11 is too thin the dopant atoms from the substrate will diffuse through it and hence it will no longer be effective. A practical range of thickness for seal layer 11 seems to be approximately 10 micrometers to 15 micrometers.

Seal layer 11 involves no patterning nor removal (partial or otherwise) and becomes a passive part of the final device structure, i.e., with the correctly chosen resistivity seal layer 11 becomes a part of substrate 10 and not part of an active device structure which would be made in subsequent epitaxial layers.

Additional epitaxial layers can be grown over seal layer 11 such as illustrated by dotted line 12. Epitaxial layer 12 can be any desired thickness, resistivity or conductivity type and can consist of one or a series of multiple epitaxial layer structures. Seal layer 11 will eliminate or substantially decrease autodoping from substrate 10 and therefore the uniformity of the dopant concentration of epitaxial layer 12 can be accurately controlled.

Figure 2:
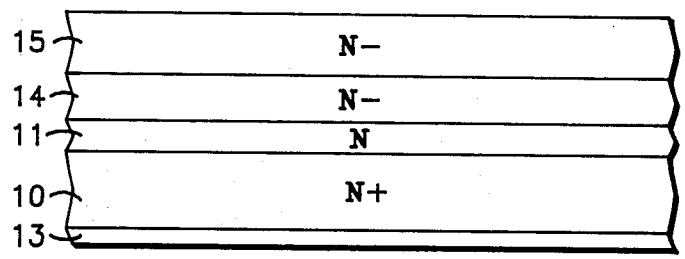
FIG. 2 illustrates a specific embodiment of the present invention.

FIG. 2 is a cross-sectional view of a semiconductor wafer having a plurality of epitaxial layers. Substrate 10 is illustrated as being an N+ low resistivity substrate FIG. 1. Epitaxial layer 14 covers epitaxial seal layer 11 and has a higher resistivity than seal layer 11. Epitaxial layer 15 covers epitaxial layer 14 and has a higher resistivity than does epitaxial layer 14. In the structure illustrated in FIG. 2, substrate 10 is a silicon wafer being heavily doped with arsenic or the like to provide a maximum resistivity of 0.0055 ohm cm. A first epitaxial layer serves as seal layer 11 and has approximately 10 micrometers thickness, and has a resistivity of approximately 1 ohm cm. Second epitaxial layer 14 has a thickness in the range of 22 to 28 micrometers and a resistivity of 3.5 to 5.5 ohm cm. Third, epitaxial layer 15 has a thickness in the range of 55 to 66 micrometers and a resistivity in the range of 45 to 80 ohm cm. Epitaxial layers 11, 14, and 15 can be doped with phosphorous, arsenic, antimony or the like to obtain the desired resistivities.

By now it should be appreciated that there has been provided an epitaxial front seal useful in the manufacturing of semiconductor wafers wherein the seal is of the same conductivity type as the substrate. In addition, the seal becomes a part of the substrate as opposed to becoming a region in the resulting device.

I claim:

1. A semiconductor wafer having a seal layer to reduce autodoping during subsequent growth of additional epitaxial layers, comprising: a semiconductor wafer of a first conductivity; a first epitaxial layer covering the semiconductor wafer to serve as the seal layer and being of the first conductivity and having a thickness in the range of 10 to 15 micrometers; and a second epitaxial layer covering the first epitaxial layer, wherein the seal layer has a resistivity of the order of 0.1 ohm cm for an N-type conductivity and a resistivity in the range of 0.5 to 4.5 ohm cm for a P-type conductivity wherein the semiconductor wafer has a maximum resistivity of 0.0055 ohm cm.

2. The semiconductor wafer of claim 1 wherein the resistivity of the semiconductor wafer is adjusted by using an arsenic dopant and the resistivity of the first and second epitaxial layers are adjusted by using a phosphorous dopant.

3. A silicon wafer having a seal layer to reduce autodoping during growth of an epitaxial layer, comprising: the silicon wafer having a low resistivity of the order of 0.005 ohm cm by being doped with arsenic; a first epitaxial layer covering the wafer and serving as the seal layer wherein the seal layer has a resistivity of approximately one ohm cm and a thickness of approximately ten micrometers; a second epitaxial layer covering the first epitaxial layer and having a resistivity in the range of 3.5 to 5.5 ohm cm and a thickness in the range of 22 to 28 micrometers; and a third epitaxial layer covering the second epitaxial layer and having a resistivity in the range of 45 to 80 ohm cm and a thickness in the range of 54 to 66 micrometers.

4. The silicon wafer of claim 3 wherein the first, second, and third epitaxial layers are doped with a phosphorous dopant so that the silicon wafer and all three layers are of the same conductivity type.

5. The silicon wafer of claim 3 wherein the thickness of the first epitaxial layer is in the range of ten to fifteen micrometers.

* * * * *